United States Patent [19]
Ting et al.

[11] Patent Number: 6,058,069
[45] Date of Patent: May 2, 2000

[54] PROTECTION CIRCUIT TO ENSURE DRAM SIGNAL IN WRITE CYCLE

[75] Inventors: Tah Kang Joseph Ting; Tien-Hsin Chang, both of Hsinchu; Bor-Doou Rong, Chupei, all of Taiwan

[73] Assignee: Etron Technology, Inc., Hsin-Chu, Taiwan

[21] Appl. No.: 09/290,923

[22] Filed: Apr. 12, 1999

[51] Int. Cl.[7] .................................................. G11C 7/00
[52] U.S. Cl. ........................................... 365/233; 365/203
[58] Field of Search ..................................... 365/233, 203, 365/189.01, 149, 189.11

[56] References Cited

U.S. PATENT DOCUMENTS

| | | | |
|---|---|---|---|
| 4,998,222 | 3/1991 | Sussman | 365/203 |
| 5,404,327 | 4/1995 | Houston | 365/233 |
| 5,703,832 | 12/1997 | Ting et al. | 365/233 |
| 5,877,988 | 3/1999 | Shim et al. | 365/233 |

*Primary Examiner*—Tan T. Nguyen
*Attorney, Agent, or Firm*—George O. Saile; Stephen B. Ackerman

[57] ABSTRACT

Methods are disclosed for a dynamic random access memory (DRAM) which ensure that the last write operation in a DRAM column cycle is not turned off before the bit line restore is completed, thus avoiding that data is destroyed in the next access. In addition these methods allow the precharge command to occur before the write data are fully restored. This is achieved by a providing a TWR Protect Circuit which adds a Timing Reference and Timing Compare circuit to the DRAM control logic, such that a last write cycle out of 'n' cycles is recognized and that the bit line restore period of the that last write cycle is extended to ensure that bit line BL and BLB reach full voltage.

15 Claims, 4 Drawing Sheets

PROTECTION CIRCUIT TO ENSURE DRAM SIGNAL IN WRITE CYCLE

BACKGROUND OF THE INVENTION

1. Field of the Invention

The invention relates to methods of timing semiconductor memories, and more particularly to insuring that there is enough time for a complete bit line restore for the last of 'n' write cycles.

2. Description of the Related Art

Frequently the last of 'n' write cycles to be written into a semiconductor memory may have difficulty writing into the cell capacitance when either the precharge command occurs at a high operating frequency or because of a weak cell transistor device (the cause could be that the cell transistor turns off too soon or low current). Why the data of the last write cycle should be affected can be explained by reference to the high level block diagram of FIG. 1 and the signal diagram of FIG. 2. When, as part of a DRAM control circuit 10, a precharge command PRE_CMD (Command, Curve 1) is received, a decoded command is generated which resets the row activation flag RA (Curve 8, Point 82) when the clock rises (Curve 2) and precharging takes place. Flag RA was generated earlier by the Row Activation Control circuit 12. This means that the wordline is turned off (see arrow A, Curve 9), resulting in the voltage difference between the bit line pair (BL and BLB of Curve 9) being much smaller than it should be, such that data may be destroyed in the next access. The 'twr' specification ('twr' is defined as "last data in to precharge") is usually one cycle, but a duration of one cycle may not be enough in the cases cited above. The period defined by 'twr' together with 'trp' (row precharge command to row activation command period) is the time from the end of the column cycle to the next row activation, when measured from rising clock to rising clock (Command, Curve 1 and CLK, Curve 2). Above Curve 1 are indicated the start of row activation, write, precharge, and the period for "write during column cycle", the end of which is marked by vertical time reference 10. Data 1 to Data 5 are shown latched up in Curve 3, labeled DQ. Curve 2 shows the clock CLK, where one cycle is the time between successive positive transitions of the clock.

Clearly a solution to the above problem is most desirable, because of the ever-present desire to decrease the cycle time of a memory.

SUMMARY OF THE INVENTION

It is an object of the present invention to provide methods to ensure that the last write operation in a DRAM column cycle is not turned off before the bit line restore is completed, thus avoiding that data is destroyed in the next access.

Another object of the present invention is to allow the precharge command before the write data are fully restored.

A further object of the present invention is to optimize a 'twr' and 'trp' period by allowing the internal TWR time on the chip to be larger than the 'twr' spec, by "stealing" time internal to the chip from TRP and giving it to TWR.

These objects have been achieved by a providing a TWR Protect Circuit which adds a Timing Reference and Timing Compare circuit to the DRAM control logic, such that a last write cycle out of 'n' cycles is recognized and that the bit line restore period of the that last write cycle is extended to ensure that bit line BL and BLB reach full voltage.

DESCRIPTION OF THE PREFERRED EMBODIMENT

When attempts are made to increase the performance of a Dynamic Random Access Memories (DRAM's) by reducing the cycle time it has been found that the data written in the last of several write cycles is frequently bad. Investigations into this phenomena have found that when a precharge cycle follows too close to the last write operation, the precharge drops the row activation flag, turning off the wordline and, thus, cutting short the restore of the bitline. The same problem occurs when, because of process variations, there is a weak cell transistor or when the current level in the bit line is too low.

The present invention corrects this problem in that it lengthens the time allowed for the last of 'n' write operations by delaying the resetting of the RA flag by the precharge command. Other benefits that accrue from this invention will be disclosed as well. Referring now to the TWR Protect Circuit block diagram of FIG. 3, we provide an overview of the method of the preferred embodiment of the present invention of protecting the last data written into a dynamic random access memory (DRAM) 10. The control circuit part of the DRAM 10 of interest consists of blocks 11 to 14. Block 11 is the Precharge Command Register with inputs PRE_CMD and RA. Block 13 is the TWR Timing Reference with input WRPLS. Block 14, the TWR Timing Compare Circuit, receives line PRCH from Block 11 and line TWR_PRO from Block 13. PRCH_TWR, the output of Block 14, feeds the Row Activation Control Circuit, Block 12, the latter producing output RA, the row activation flag. Output RA also feeds back to Block 11.

Figure 1:
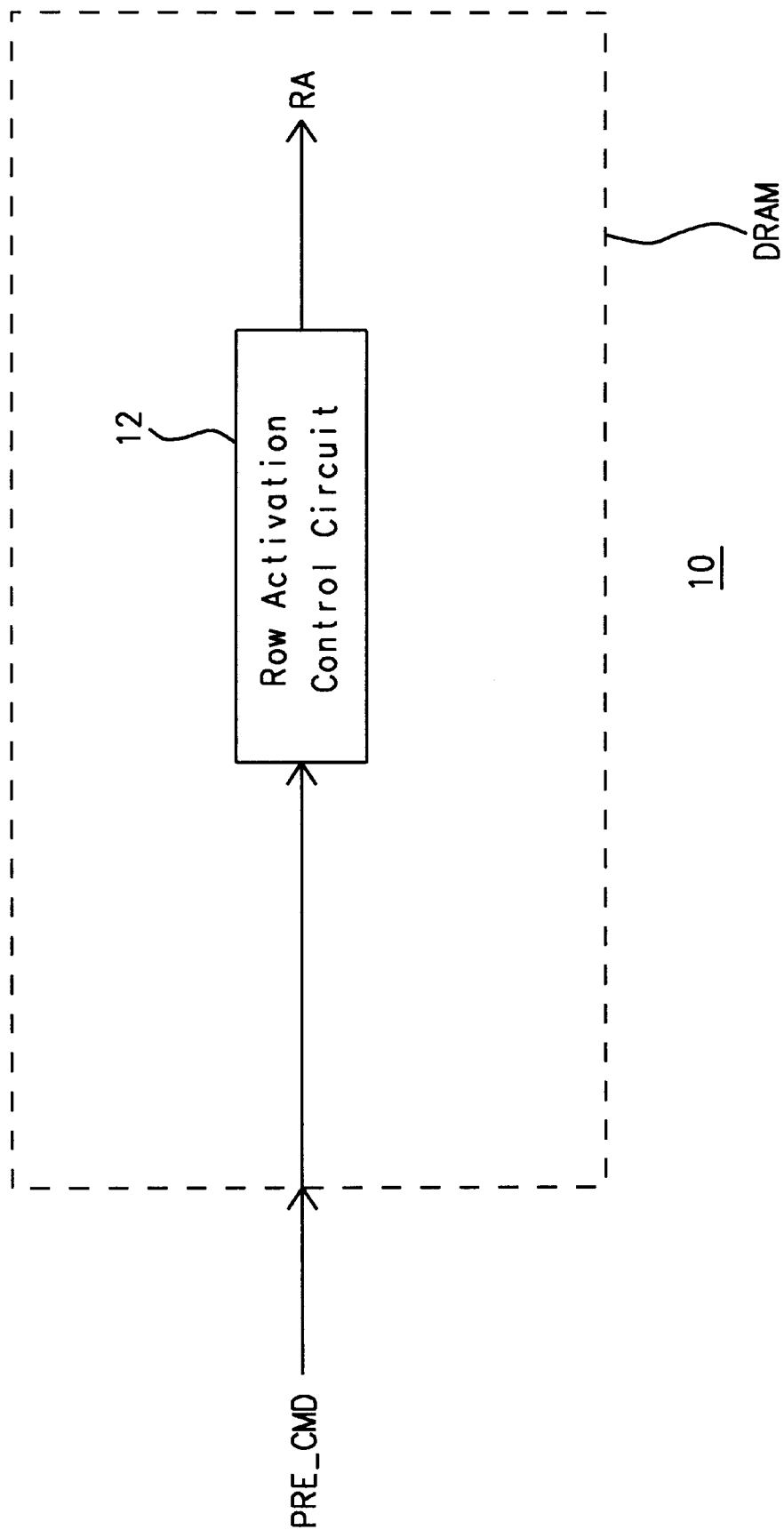
FIG. 1 is a high level block diagram of the prior art.
Figure 2:
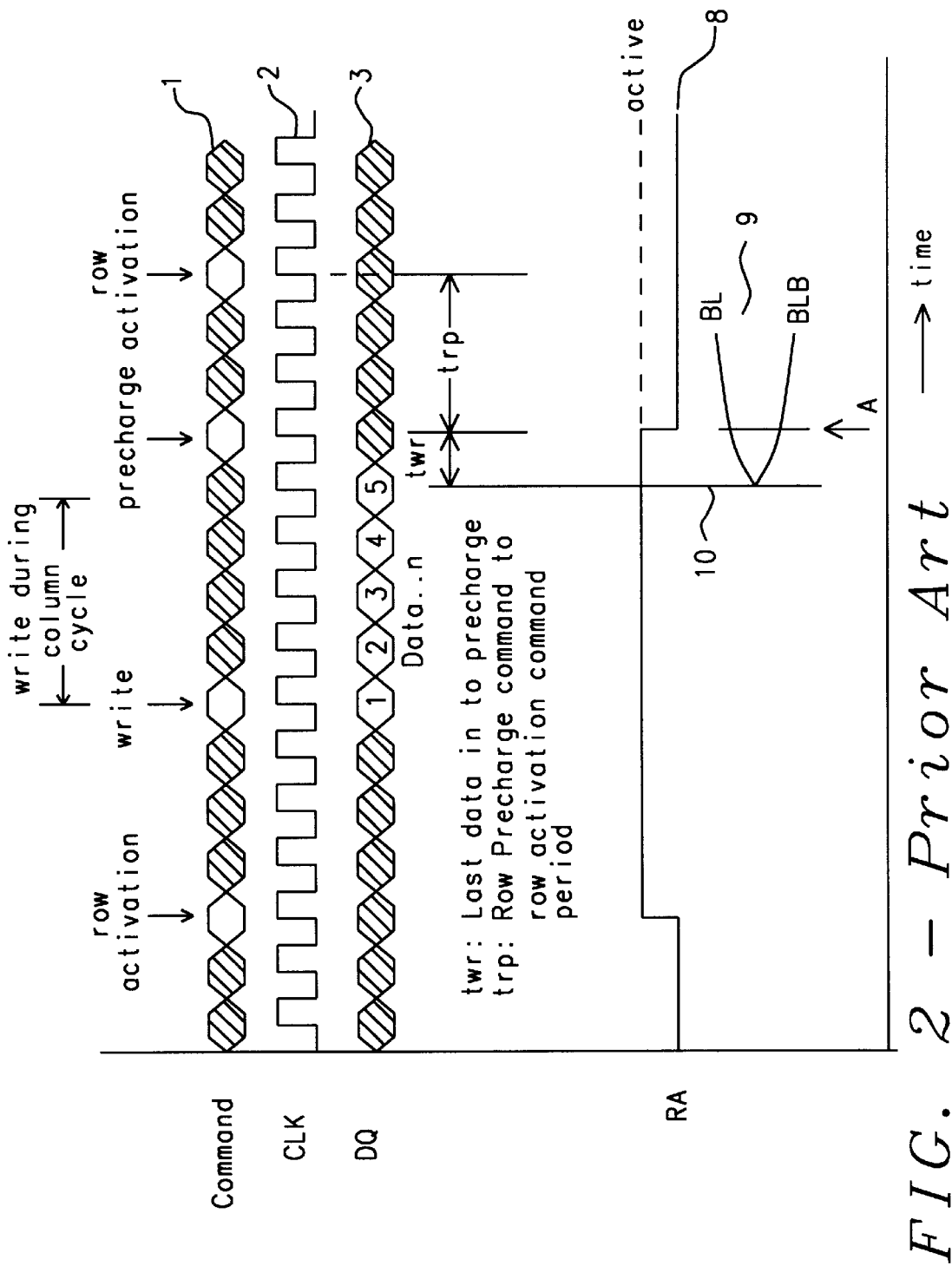
FIG. 2 is a view of the input and output signals of the block diagram of FIG. 1.
Figure 3:
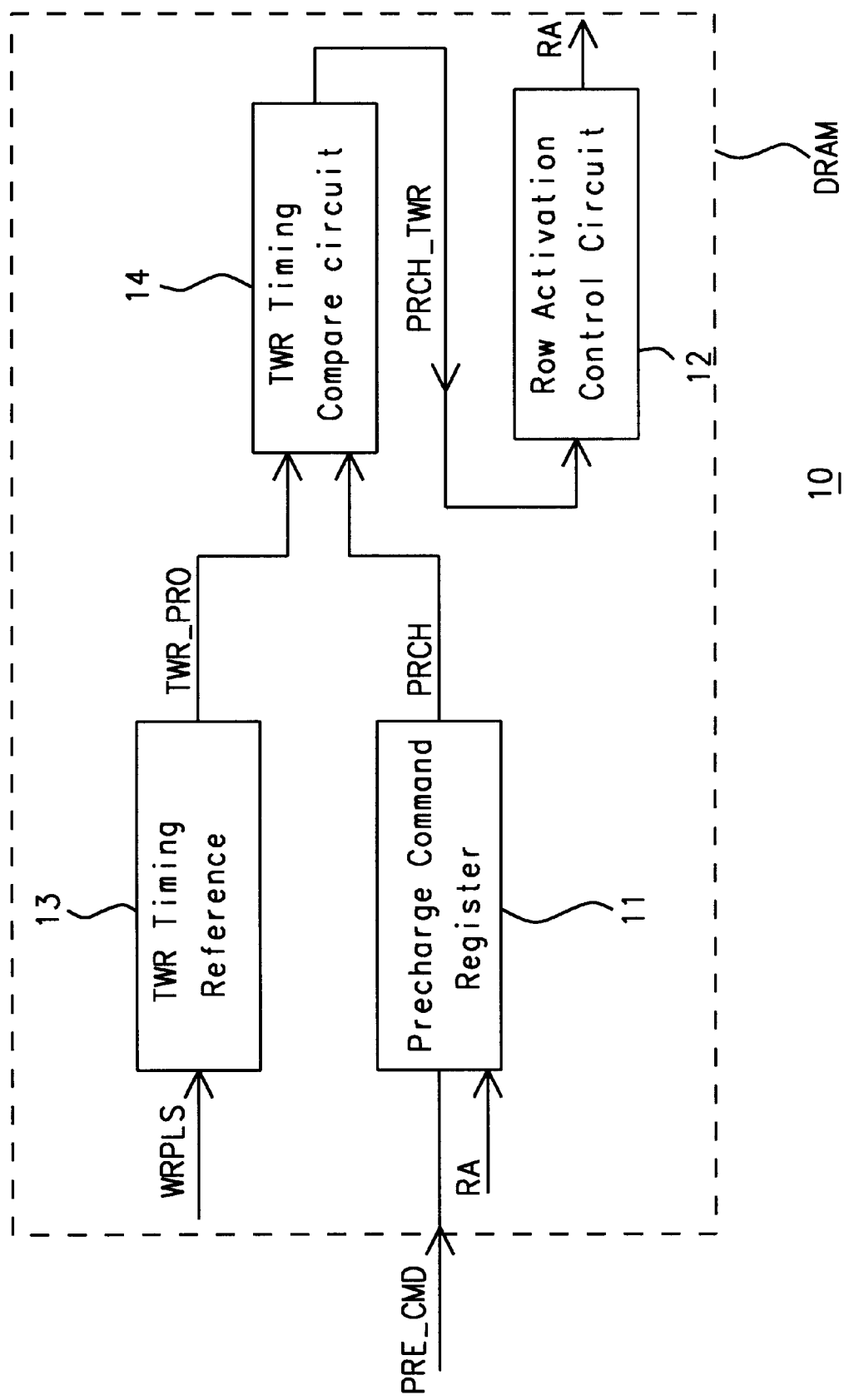
FIG. 3 is a high level block diagram of a preferred embodiment of the present invention.
Figure 4:
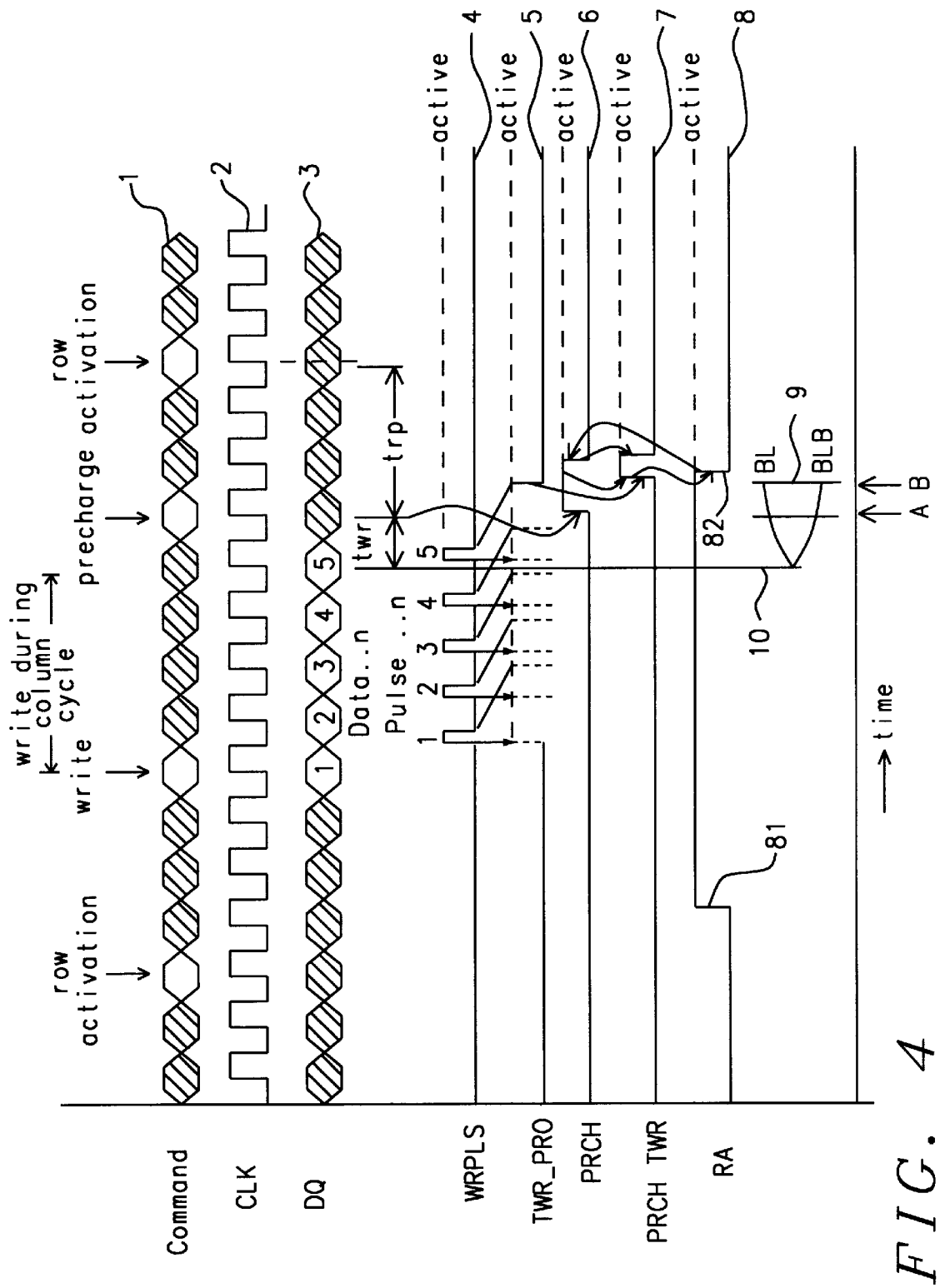
FIG. 4 is a view of the input and output signals of the block diagram of FIG. 3.

Referring now to both FIG. 3 and the timing diagram of FIG. 4, the method of the invention comprises the following steps:

generating a row activation flag RA at the output of Row Activation Control circuit 12 upon receiving a row activation command, see Curve 8, Point 81;

generating 'n' WRPLS pulses to initiate 'n' write operations during a column cycle, see Curve 4—(we have shown 5 pulses, Pulse 1 to Pulse 5, as an illustrative example, but this is not meant to limit the scope of the invention);

applying these 'n' WRPLS pulses to the input of TWR Timing Reference 13;

generating 'n' TWR_PRO pulses, see Curve 5, at the output of TWR Timing Reference 13 in response to the 'n' WRPLS pulses. The falling edge of Pulses 1–5 charges a capacitor in the TWR Timing Reference 13, while the rising edge of Pulses 1–5 discharges the capacitor. Thus, between Pulse 1 and Pulse 5 signal TWR_PRO never rises much. However, when the last pulse drops (Pulse 5) the capacitor charges up to the full voltage, which causes the TWR_PRO signal to drop.

In order to distinguish timing parameters between the internal timing (such as TWR) and the conventional timing specifications (such as 'twr' and 'trp') in DRAM data sheets, we define these parameters by upper and lower case. Consequently, TWR is used in internal timing and 'twr' and 'trp' are used in conventional timing specifications as in DRAM data sheets.

Referring specifically to FIG. 4, the time between WRPLS pulses equals one clock cycle, Curve 2, equal to the period TWR, which is also the minimum specified time necessary to complete the bit line restore. Above Curve 1 are indicated the start of row activation, write, precharge, and the period for "write during column cycle", the end of which is marked by vertical time reference 10. Data 1 to Data 5 are shown latched up in Curve 3, labeled DQ. Curve 2 shows the clock CLK, where one cycle is the time between successive positive transitions of the clock. The period defined by TWR together with TRP (row precharge command to row activation command period) is the time from the end of the column cycle to the next row activation, when measured from rising clock to rising clock (Command, Curve 1 and CLK, Curve 2).

The 'twr' specification in a typical DRAM generally is one clock cycle (1 tick), 'trp' generally is 2–3 clock cycles. TWR of the chip (internal timing!) may have to be larger than the specification to protect the last data by "stealing" some time (internal to the chip) from TRP to give to TWR.

Referring again to FIG. 3 and FIG. 4, the method of the invention continues with receiving precharge command PRE_CMD and latching the command in the Precharge Command Register 11, see Curve 1 labeled Command. In response to PRE_CMD, register 11 generates a PRCH pulse 61 at the output of register 11, see Curve 6. The PRCH line rises to the active level, after a small delay, at the end of period 'twr' and the start of the precharge cycle, see arrow labeled 'precharge' above Curve 1.

The method of the present invention concludes with applying the 'n' TWR_PRO pulses, Curve 5, and the PRCH pulse 61, Curve 6, to the two inputs of the TWR Timing Compare circuit 14, and generating a PRCH_TWR pulse, Curve 7, at the output of Block 14 when the last of the 'n' TWR_PRO pulses falls and when PRCH pulse is present (active); and applying the PRCH_TWR pulse to the input of Row Activation Control circuit 12, and upon the rise of PRCH_TWR resetting the RA flag, Point 82 of Curve 8. The falling edge of Row Activation Flag RA in turn resets the PRCH pulse 61, and then PRCH_TWR goes inactive (low), ending the write cycle. The rising edge of the PRCH_TWR pulse signals that the last data has been written into all cell capacitances.

Curve 9, illustrates what effect the present invention has on the bit line restore curve. In the related art the bit line restore of the last cycle is cut off prematurely as indicated by arrow A, now the bit line can restore to the full voltage as indicated by arrow B.

The precharge command PRE_CMD may be received and placed into the Precharge Command Register before bit lines BL and BLB, Curve 9, are fully restored. Actually, the precharge command PRE_CMD may be received and placed into the register of Block 11 at any time in the write cycle, because the command activation depends on the TWR_PRO signal falling.

The duration of the TWR_PRO pulse is set to provide sufficient time to complete writing data into all cell capacitances, i.e., it provides the time necessary to insure that the voltage difference of the bit line pair (BL and BLB of Curve 9) is large enough that data is not destroyed in the next access.

Pulse width variations of the TWR_PRO pulses, caused by process variations in the TWR Timing Reference 13, and the time required to write data into all cell capacitances track each other, so that changes in the one have the same effect in the other. Circuits of the TWR Timing Reference and the memory cells track each other because they are on the same chip and use similar devices.

The proposed invention does not interfere with a read during a column cycle because the read operation allows the precharge command PRE_CMD to reset the Row Activation Flag RA immediately. During a read cycle, WRPLS stays low (inactive), so the protect circuit of the present invention is not operational and the RA flag is reset immediately, as in a conventional DRAM operation.

Advantages of the invention are that the last data written into memory is assured that 'bit line restore' is completed even when precharge occurs at a higher frequency or when there are weak cell transistors or other process induced variations. Other advantage are:

a precharge command can be allowed before the write data are fully restored (precharge still occurs but after the last data is written), the time for TWR and TRP can be optimized using the TWR Timing Reference, when a read state occurs in the column cycle, the precharge command can reset the RA flag without any delay, memory chips that would have failed before and had to been discarded can now be used—clearly of considerable economic impact, the proposed invention requires simple modifications to the DRAM control circuits without affecting the memory circuits or involving expensive device redesign to achieve higher speeds.

While the invention has been particularly shown and described with reference to the preferred embodiments thereof, it will be understood by those skilled in the art that various changes in form and details may be made without departing from the spirit and scope of the invention.

What is claimed is:

1. A method of protecting the last data written into a DRAM, comprising the steps of:

applying 'n' WRPLS pulses to a timing reference means to initiate 'n' write operations during a column cycle;

generating 'n' TWR_PRO pulses in response to said 'n' WRPLS pulses;

receiving and registering a precharge command;

ending a bitline precharge only after the last of said 'n' TWR_PRO pulses has fallen;

issuing said precharge command only after the last of said 'n' TWR_PRO pulses has fallen; and increasing an internal chip TWR time by reducing an internal chip TRP time to protect last data written.

2. The method of claim 1, wherein each of said 'n' TWR_PRO pulses has a pulse width exceeding an internal TWR time specification.

3. The method of claim 2, wherein said internal TWR time specification is the minimum time necessary to completly write data into all cell capacitances.

4. The method of claim 1, wherein pulse width variations of said TWR_PRO pulses, caused by process variations in said timing reference means and the time required to write data into all cell capacitances track each other.

5. The method of claim 1, wherein said precharge command may be received and registered before bit lines are fully restored.

6. A method of protecting the last data written into a DRAM, comprising the steps of:

generating a row activation flag at output of row activation control means upon receiving a row activation command;

generating 'n' WRPLS pulses to initiate 'n' write operations during a column cycle;

applying said 'n' WRPLS pulses to an input of a timing reference means;

generating 'n' TWR_PRO pulses at an output of said timing reference means in response to said 'n' WRPLS pulses;

applying said 'n' TWR_PRO pulses to a first input of a timing compare means;

receiving a precharge command and registering said precharge command in a register means;

generating a PRCH pulse at an output of said register means in response to said precharge command;

applying said PRCH pulse to a second input of said timing compare means;

generating a PRCH_TWR pulse at an output of said timing compare means in response to the last of said 'n' TWR_PRO pulses falling and the presence of said PRCH pulse;

applying said PRCH_TWR pulse to a row activation control means;

resetting said row activation flag upon receiving said PRCH_TWR pulse; and increasing an internal chip TWR time by reducing an internal chip TRP time to protect last data written.

7. The method of claim 6, wherein each of said 'n' TWR_PRO pulses is longer in duration than the spacing of said WRPLS pulses.

8. The method of claim 6, wherein the last of said 'n' TWR_PRO pulses drops while said PRCH pulse is active.

9. The method of claim 6, wherein the rising edge of said PRCH_TWR pulse causes said row activation flag to drop.

10. The method of claim 6, wherein the rising edge of said PRCH_TWR pulse signals that said last data has been written into all cell capacitances.

11. The method of claim 6, wherein the falling edge of said row activation flag resets said PRCH pulse.

12. The method of claim 6, wherein each of said 'n' TWR_PRO pulses has a pulse width exceeding an internal TWR time specification.

13. The method of claim 6, wherein the duration of said TWR_PRO pulse is set to provide sufficient time to complete writing data into all cell capacitances.

14. The method of claim 6, wherein pulse width variations of said TWR_PRO pulses, caused by process variations in said timing reference means and the time required to write data into all cell capacitances track each other.

15. The method of claim 6, wherein a read during said column cycle allows said precharge command to reset said row activation flag immediately.

* * * * *